(12) United States Patent
Kurita et al.

(10) Patent No.: US 7,759,786 B2
(45) Date of Patent: Jul. 20, 2010

(54) ELECTRONIC CIRCUIT CHIP, AND ELECTRONIC CIRCUIT DEVICE AND METHOD FOR MANUFACTURING THE SAME

(75) Inventors: Yoichiro Kurita, Kanagawa (JP); Koji Soejima, Kanagawa (JP); Masaya Kawano, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 797 days.

(21) Appl. No.: 11/543,079

(22) Filed: Oct. 5, 2006

(65) Prior Publication Data
US 2007/0080444 A1    Apr. 12, 2007

(30) Foreign Application Priority Data
Oct. 7, 2005    (JP) .............................. 2005-295052

(51) Int. Cl.
*H01L 23/12* (2006.01)
(52) U.S. Cl. .................. 257/700; 257/778; 257/779; 257/E23.085; 257/E21.503; 257/E21.508
(58) Field of Classification Search .............. 257/778, 257/779, E23.085, 700, E21.503, E21.508
See application file for complete search history.

(56) References Cited

U.S. PATENT DOCUMENTS 5,534,465 A * 7/1996 Frye et al. .................... 438/108
5,844,317 A * 12/1998 Bertolet et al. ............... 257/773
5,898,223 A * 4/1999 Frye et al. .................... 257/777
6,222,212 B1 * 4/2001 Lee et al. ..................... 257/207
6,352,925 B1 * 3/2002 Schrock ....................... 438/687

OTHER PUBLICATIONS

J. McMahon, et al., "Wafer Bonding of Damascene-Patterened Metal/Adhesive Redistribution Layers for Via-First Three-Dimensional (3D) Interconnect", 2005 Electronic Components and Technology Conference, pp. 331-336.

* cited by examiner

Primary Examiner—Eugene Lee
Assistant Examiner—Peniel M Gumedzoe
(74) Attorney, Agent, or Firm—McGinn Intellectual Property Law Group, PLLC

(57) ABSTRACT

An insulating layer 12 is formed as a surface layer of electronic circuit chip 10. A conductor interconnect 14 is formed in the insulating layer 12. The conductor interconnect 14 is exposed in the surface of the insulating layer 12. A solder wetting metallic film 16 (a metallic film) is formed on a portion of the conductor interconnect 14 to be exposed in the surface of the insulating layer 12. Typical metallic material (second metallic material) available for composing the solder wetting metallic film 16 includes a material that requires higher free energy for forming an oxide thereof, as compared with a free energy required for forming an oxide of the metallic material composing the conductor interconnect 14.

14 Claims, 14 Drawing Sheets

ELECTRONIC CIRCUIT CHIP, AND ELECTRONIC CIRCUIT DEVICE AND METHOD FOR MANUFACTURING THE SAME

This application is based on Japanese patent application No. 2005-295052, the content of which is incorporated hereinto by reference.

BACKGROUND

1. Technical Field

The present invention relates to an electronic circuit chip, and an electronic circuit device and a method for manufacturing thereof.

2. Related Art

Conventional electronic circuit devices include an electronic circuit device disclosed by, for example, the non-patent document 1 cited below. In an electronic circuit device described thereof, first and second electronic circuit chips are mutually joined. Respective electronic circuit chips include a benzocyclobutene (BCB) resin layer provided as a surface layer in the side of the joined surface and a copper (Cu) pad formed in the BCB resin layer. The Cu pad is exposed in the surface of the BCB resin. The first and second electronic circuit chips are mutually joined by connecting the Cu pads by a thermo compression-bonding.

(Non-patent document 1) J. McMahon et al., "Wafer Bonding of Damascene-Patterned Metal/Adhesive Redistribution Layers for Via-First Three-Dimensional (3D) Interconnect", 2005 Electronic Components and Technology Conference, pp. 331-336

SUMMARY OF THE INVENTION

However, when the metal juncture between Cu members is employed in this way, a thermo compression bonding process conducted at an elevated temperature for longer time is required, in order to obtain sufficient metal juncture. Actually, the non-patent document 1 discloses that a heating process at a temperature of equal to or higher than 350 degree C. for equal to or longer than 90 minutes is required. Therefore, there is a narrower choice for selecting materials for composing the electronic circuit chip (insulating material, for example). This is because a range of the available materials is limited to materials that exhibits a resistance to an elevated temperature environment in the thermo compression bonding process.

On the contrary, if a solder layer is formed in advance in a surface layer of one of the electronic circuit chips and then a Cu pad of the other electronic circuit chip is connected to the solder layer, the juncture can be formed at a lower temperature for shorter time. However, in such case, a problem may be caused in the connection reliability between Cu and solder.

The present inventors have eagerly investigated on such issue, and have found that a part of the reason for reducing the connection reliability between Cu and solder is that a wettability of Cu for solder is reduced by a natural oxidation of a surface of Cu.

According to the present invention, there is provided an electronic circuit chip having an insulating layer provided as a surface layer, comprising a patterned conductor, provided in the insulating layer and exposed in a surface of the insulating layer; and a metallic film, provided on a portion of the patterned conductor and composed of a second metallic material, which requires higher free energy for forming an oxide than a free energy that is required by a first metallic material for forming an oxide, the first metallic material composing the patterned conductor.

In this electronic circuit chip, a metallic film is provided on the patterned conductor. The metallic film is composed of a metallic material, which requires higher free energy for forming an oxide thereof than a free energy that is required for forming an oxide of another metallic material, which composes the patterned conductor. More specifically, the metallic film has a property that it is more difficult to be oxidized than the patterned conductor. Therefore, when this electronic circuit chip is joined to another electronic circuit chip having solder provided on the surface thereof, the above-described metallic film may be interposed therebetween, so that an improved connection reliability is obtained between the patterned conductor and the solder.

According to the present invention, there is also provided an electronic circuit device, comprising a first electronic circuit chip, which is the electronic circuit chip according to the present invention; and a second electronic circuit chip, which is joined to the first electronic circuit chip in the side of the surface layer, wherein the second electronic circuit chip includes a resin layer provided in a surface layer in the side of the first electronic circuit chip; and a solder layer, provided in the resin layer and exposed in a surface of the resin layer, and wherein the first and second electronic circuit chips are joined to each other by connecting the metallic film and the solder layer.

In this electronic circuit device, the patterned conductor of the first electronic circuit chip is connected to the solder layer of the second electronic circuit chip via the above-described metallic film. This provides an improved connection reliability between the patterned conductor and the solder layer.

According to the present invention, there is also provided a method for manufacturing an electronic circuit device, comprising (a) preparing a first electronic circuit chip, which is the electronic circuit chip according to the present invention; (b) preparing a second electronic circuit chip that includes a resin layer provided in a surface layer and a solder layer provided in the resin layer and exposed in a surface of the resin layer; and (c) connecting the metallic film of the first electronic circuit chip and the solder layer of the second electronic circuit chip by heating the solder layer, while the solder layer is pressed against the metallic film.

In this method for manufacturing an electronic circuit device, the patterned conductor of the first electronic circuit chip is connected to the solder layer of the second electronic circuit chip via the above-described metallic film. This provides an improved connection reliability between the patterned conductor and the solder layer.

According to the present invention, an electronic circuit chip, which is capable of exhibiting an improved connection reliability with other electronic circuit chips, and an electronic circuit device including the electronic circuit chip and a method for manufacturing thereof are achieved.

BRIEF DESCRIPTION OF THE DRAWINGS

The above and other objects, advantages and features of the present invention will be more apparent from the following description taken in conjuncture with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Preferable embodiments for illustrating an electronic circuit chip and an electronic circuit device according to the present invention, and a method for manufacturing thereof, will be described in detail, in reference to the annexed figures. In all figures, identical numeral is assigned to an element commonly appeared in the figures, and the detailed description thereof will not be presented.

Figure 1:
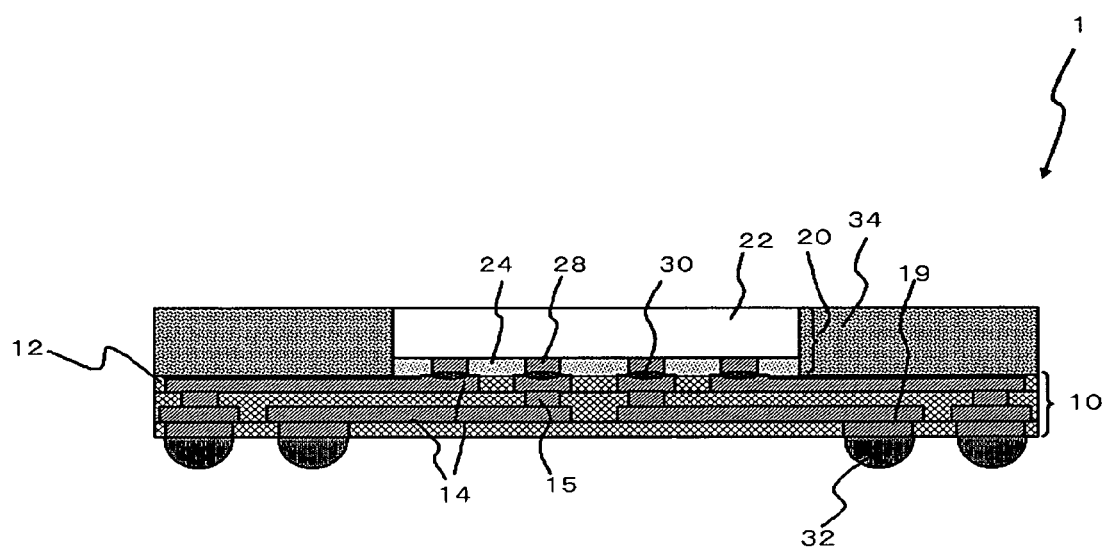
FIG. 1 is a cross-sectional view, illustrating an embodiment of an electronic circuit device according to the present invention.

FIG. 1 is a cross-sectional view, illustrating an embodiment of an electronic circuit device according to the present invention. An electronic circuit device 1 includes an electronic circuit chip 10 (first electronic circuit chip) and an electronic circuit chip 20 (second electronic circuit chip).

The electronic circuit chip 10 is an interconnect member. More specifically, the electronic circuit chip 10 includes a conductor interconnect 14 (patterned conductor), and meanwhile includes no semiconductor element. In the present embodiment, in particular, the electronic circuit chip 10 has a multiple-layered interconnect structure. The conductor interconnects 14, which are respectively formed in adjacent layers, are mutually connected by a via plug 15. In addition, an external electrode pad 19 is formed on the conductor interconnect 14 of the lowermost layer. A solder bump 32, serving as an external electrode terminal, is connected to the external electrode pad 19.

The electronic circuit chip 20, includes a semiconductor chip 22, an adhesive resin layer 24 (resin layer) and conductor electrodes 28. The semiconductor chip 22 is, for example, large scale integrated circuit (LSI) chip. Side surfaces of such electronic circuit chip 20 are covered with an encapsulating resin 34. In addition to above, both sides of the side surfaces and the top surface of the electronic circuit chip 20 (back surface of semiconductor chip 22) may be covered with the encapsulating resin 34.

Figure 2:
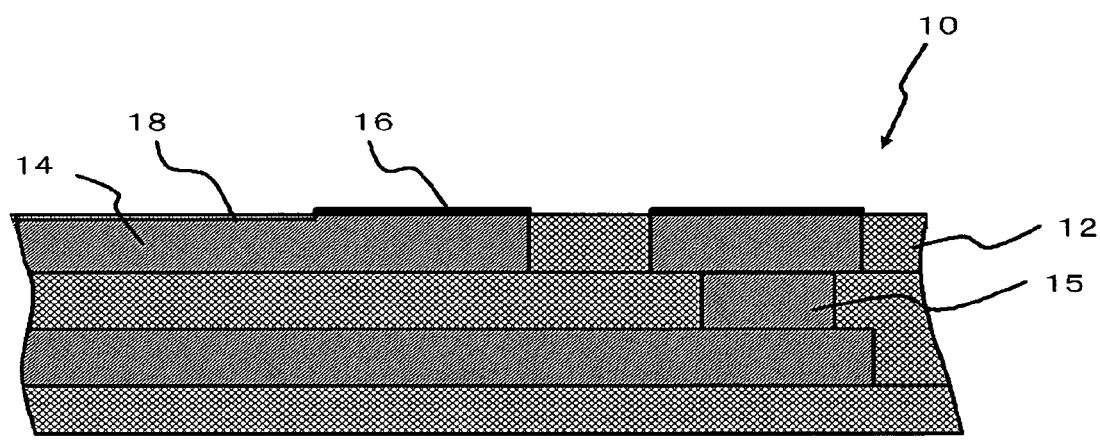
FIG. 2 is a cross-sectional view, illustrating a portion of a first electronic circuit chip according to an embodiment.

FIG. 2 is a cross-sectional view, illustrating a portion of the electronic circuit chip 10. The configuration of the electronic circuit chip 10 will be further described in detail, in reference to FIG. 2. An insulating layer 12 is formed as a surface layer of the electronic circuit chip 10. A conductor interconnect 14 is formed in the insulating layer 12. The conductor interconnect 14 is exposed in the surface of the insulating layer 12. More specifically, the whole side surface of the conductor interconnect 14 provided in the insulating layer 12 is covered with the insulating layer 12, and meanwhile, the whole top surface of the conductor interconnect 14 is exposed in the surface of the insulating layer 12. Here, "the top surface of the conductor interconnect 14 is exposed in the surface of the insulating layer 12" means that the top surface is not covered with the insulating layer 12, regardless of whether or not the top surface is exposed outside. Typical metallic material (first metallic material) for composing the conductor interconnect 14 includes, for example, copper (Cu), nickel (Ni) and aluminum (Al).

A solder wetting metallic film 16 (metallic film) is formed on a portion of the conductor interconnect 14 exposed in the surface of the insulating layer 12. Typical metallic material (second metallic material) available for composing the solder wetting metallic film 16 includes a material that requires higher free energy for forming an oxide thereof, as compared with a free energy required for forming an oxide of the above-described first metallic material. Typical second metallic material includes, for example, gold (Au), silver (Ag), platinum (Pt) and palladium (Pd). A metal oxide film 18 is formed on a region where no solder wetting metallic film 16 is provided in the exposed region on the conductor interconnect 14, which is exposed on the surface of the insulating layer 12. The metal oxide film 18 is composed of an oxide of the above-described first metallic material.

Figure 3:
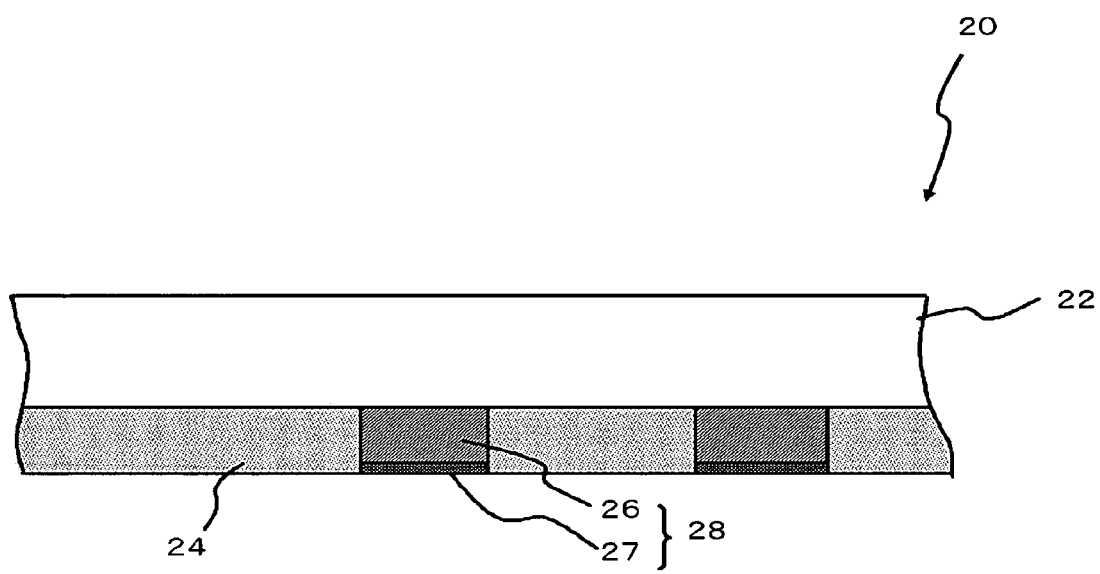
FIG. 3 is a cross-sectional view, illustrating a portion of a second electronic circuit chip according to an embodiment.

FIG. 3 is a cross-sectional view, illustrating a portion of the electronic circuit chip 20. The configuration of the electronic circuit chip 20 will be further described in detail, in reference to FIG. 3. An adhesive resin layer 24 is formed on one side of the semiconductor chip 22. This provides a configuration of the electronic circuit chip 20, in which an adhesive resin layer 24 is provided as a surface layer in the side thereof facing the electronic circuit chip 10. Typical resin available for composing the adhesive resin layer 24 may be, for example, a thermoplastic resin or a partially cured (B-stage) thermosetting resin. Typical examples for the former and the latter resins may be polyimide resin and benzocyclobutene (BCB) resin, respectively.

A conductor electrode 28 is formed in the adhesive resin layer 24. The conductor electrode 28 is composed of a conductor layer 26 and a solder layer 27. The solder layer 27 is formed on one end surface of the conductor layer 26, and another end of the conductor layer 26 is connected to the semiconductor chip 22. The solder layer 27 is exposed in the surface of the adhesive resin layer 24.

Typical solder material composing the solder layer 27 may include tin (Sn), tin-silver (SnAg), tin-copper (SnCu) and tin-silver-copper (SnAgCu). In addition to above, the conductor material available for composing the conductor layer 26 may be a material, which exhibits higher melting point than that of the solder material composing the solder layer 27. Typical conductor material may be, for example, Cu or Ni. In addition to above, the conductor layer 26 may have a multiple-layered structure of Cu and Ni.

Figure 4:
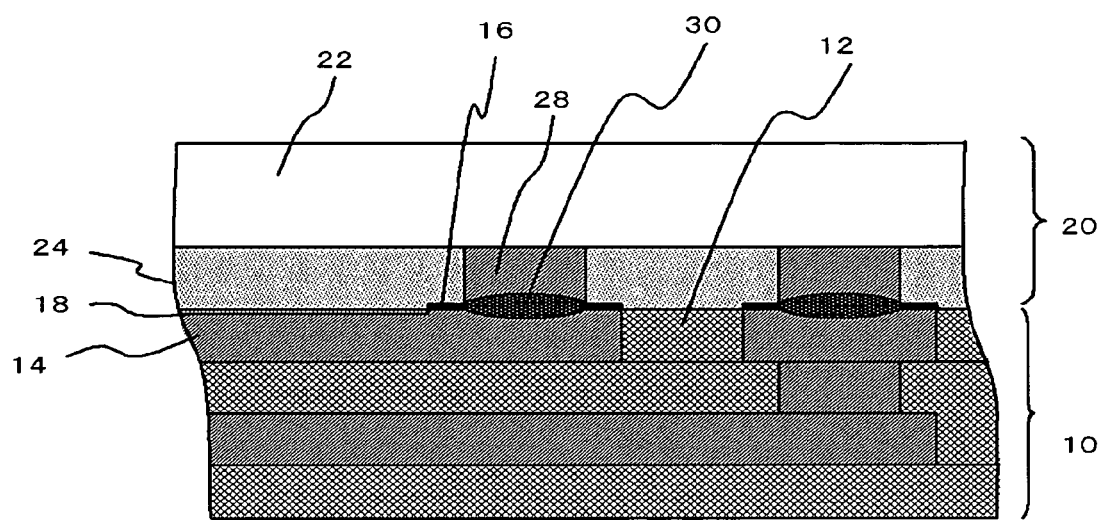
FIG. 4 is a cross-sectional view, illustrating a portion of the electronic circuit device shown in FIG. 1.

FIG. 4 is a cross-sectional view, illustrating a portion of the electronic circuit device 1. A configuration of a juncture between the electronic circuit chips 10 and 20 in the electronic circuit device 1 will be described in reference to FIG. 4. The electronic circuit chips 10 and 20 are mutually joined by connecting the solder wetting metallic film 16 of the electronic circuit chip 10 and the solder layer 27 of the electronic circuit chip 20 (see FIG. 3). The solder wetting metallic film 16 and the solder layer 27 compose an alloy layer 30. The alloy layer 30 includes at least metallic element that composes the solder wetting metallic film 16 and metallic element that composes the solder layer 27. For example, when material composing the conductor interconnect 14, the solder wetting metallic film 16, the conductor layer 26 and the solder layer 27 are Cu, Au, Cu and SnAg, respectively, the alloy layer 30 serves as an alloy-diffusion layer containing Cu, Sn and Au. In addition, in the joined surface between the electronic circuit chips 10 and 20, the metal oxide film 18 of the electronic circuit chip 10 is connected to the adhesive resin layer 24 of the electronic circuit chip 20.

An example of a method for manufacturing the electronic circuit device 1 will be described as an exemplary implementation of a manufacture of an electronic circuit device according to the present invention, in reference to FIG. 5A to FIG. 12. By summarizing the process, the process for manufacturing the electronic circuit device includes: preparing the electronic circuit chip 10; preparing the electronic circuit chip 20; and connecting the solder wetting metallic film 16 of the electronic circuit chip 10 and the solder layer 27 of the electronic circuit chip 20 by heating the solder layer 27, while the solder layer 27 is pressed against the solder wetting metallic film 16. In addition to above, the operation of preparing the electronic circuit chip 10 and the operation of preparing the electronic circuit chip 20 are carried out in an arbitrary sequential order.

Figure 5A:
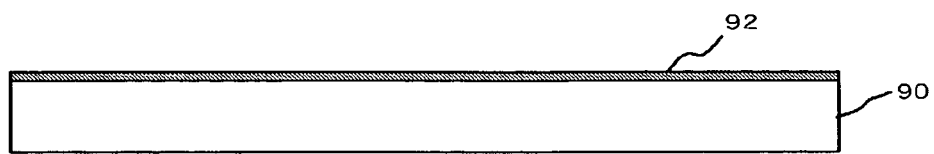
FIGS. 5A and 5B are cross-sectional views of an electronic circuit device, illustrating one embodiment of a method for manufacturing the electronic circuit device according to the present invention.
Figure 5B:
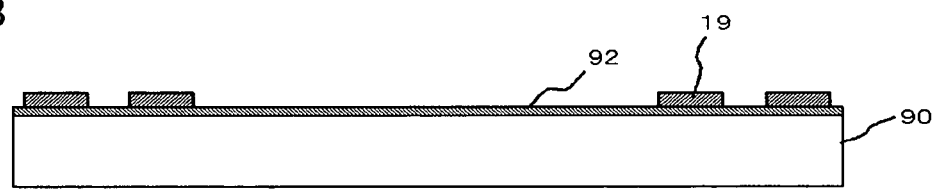
Figure 6A:
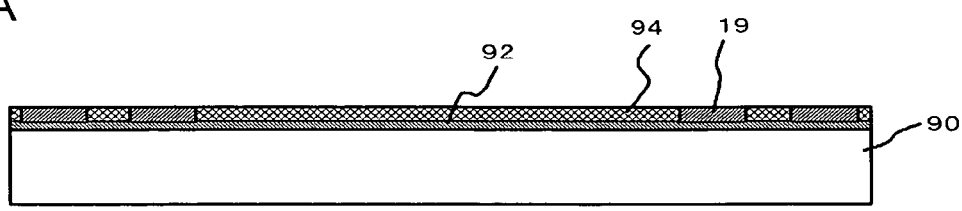
FIGS. 6A and 6B are cross-sectional views of the electronic circuit device, illustrating the embodiment of the method for manufacturing the electronic circuit device according to the present invention.

First of all, a Cu film 92 is formed on a silicon wafer 90 that serves as a support substrate by a process such as a sputter process or the like (FIG. 5A). Next, an external electrode pad 19 is formed on the Cu film 92 by employing a photolithographic process and a plating process (FIG. 5B). Subsequently, an insulating resin layer 94 is formed on the Cu film 92 so as to cover the external electrode pad 19. Thereafter, a top surface of the external electrode pad 19 is exposed by a planarization process such as a chemical mechanical polishing (CMP) process, a grinding process and a cutting process (FIG. 6A). Various types of resins such as polyimide resin, epoxy resin may be employed for an insulating resin composing the insulating resin layer 94.

Figure 6B:
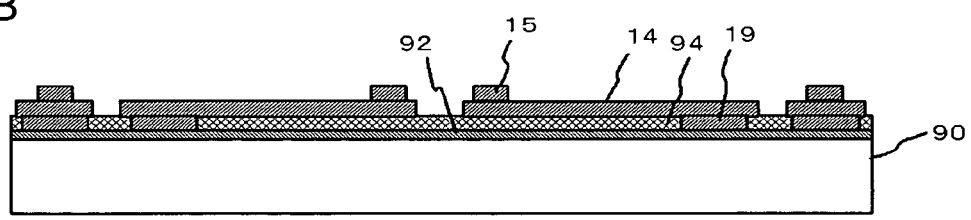
Figure 7A:
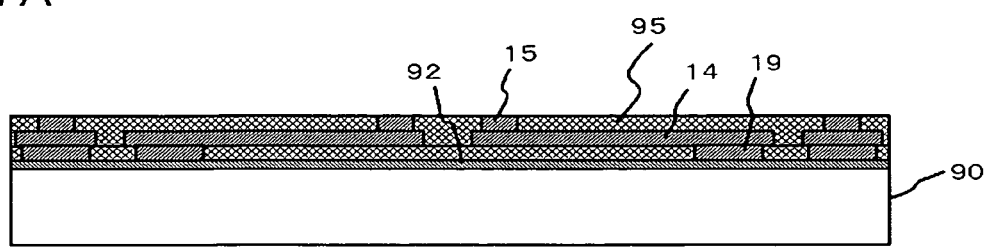
FIGS. 7A and 7B are cross-sectional views of the electronic circuit device, illustrating the embodiment of the method for manufacturing the electronic circuit device according to the present invention.
Figure 7B:
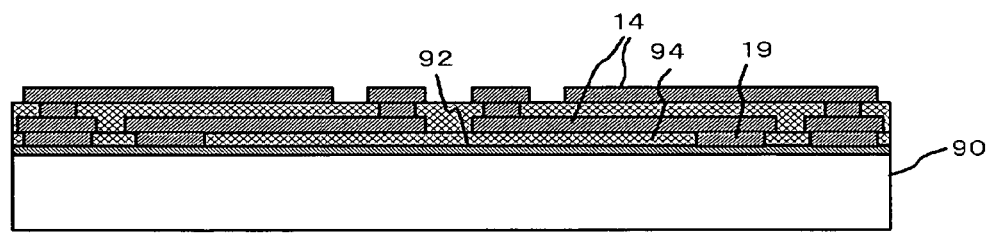

Further, the conductor interconnects 14 (lower conductor interconnects 14 in FIG. 1), which are respectively connected to the external electrode pads 19, are formed on the insulating resin layer 94, and then, via plugs 15 respectively connected to the conductor interconnects 14 are formed on this conductor interconnect 14 (FIG. 6B). Subsequently, an insulating resin layer 95 is formed on the insulating resin layer 94, so as to cover the conductor interconnects 14 and the via plugs 15. Thereafter, top surfaces of via plugs 15 are exposed by the above-described planarization process (FIG. 7A). Next, the conductor interconnects 14 (upper conductor interconnect 14 in FIG. 1) are formed on the insulating resin layer 95 (FIG. 7B).

Figure 8A:
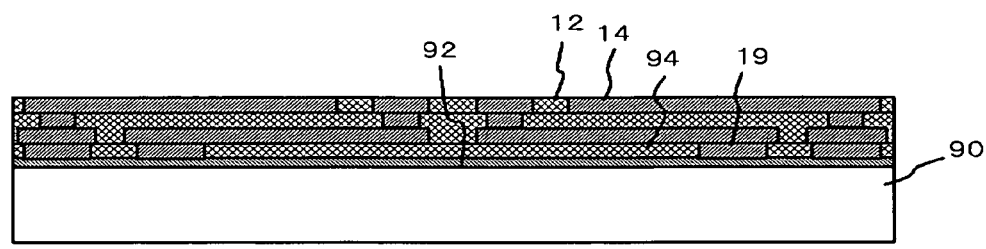
FIGS. 8A and 8B are cross-sectional views of the electronic circuit device, illustrating the embodiment of the method for manufacturing the electronic circuit device according to the present invention.
Figure 8B:
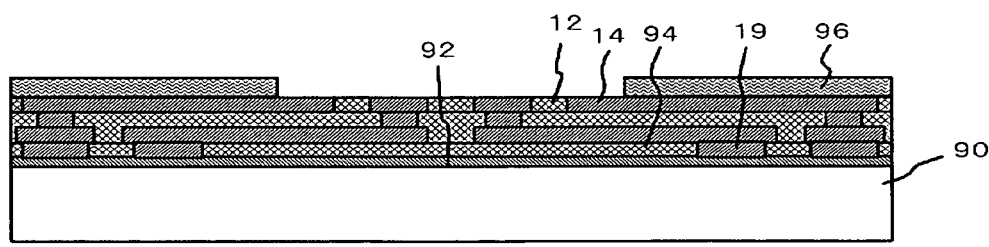

Subsequently, an insulating resin layer (insulating layer 12) is formed to cover the conductor interconnect 14, and then, a top surface of the insulating layer 12 is exposed by the above-described planarization process (FIG. 8A). Next, a resist layer 96 is formed on the insulating layer 12 except the portions for forming the solder wetting metallic film 16 (FIG. 8B). Typical process for forming thereof may include a photolithographic process employing a photo resist and a printing process for printing a resist.

Figure 9A:
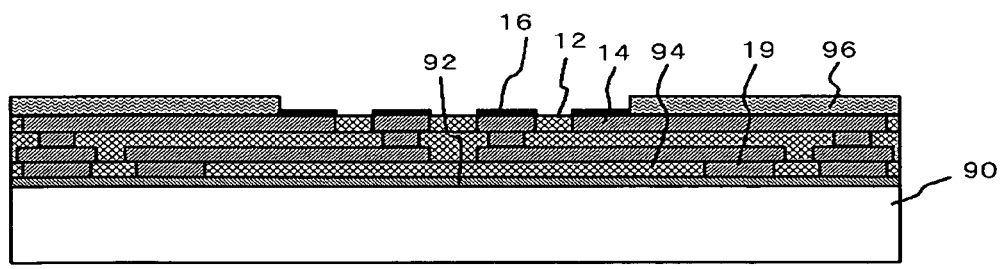
FIGS. 9A and 9B are cross-sectional views of the electronic circuit device, illustrating one embodiment of a method for manufacturing the electronic circuit device according to the present invention.
Figure 9B:
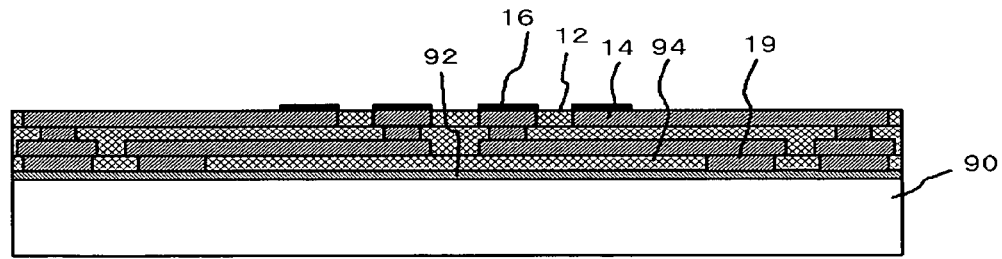
Figure 10A:
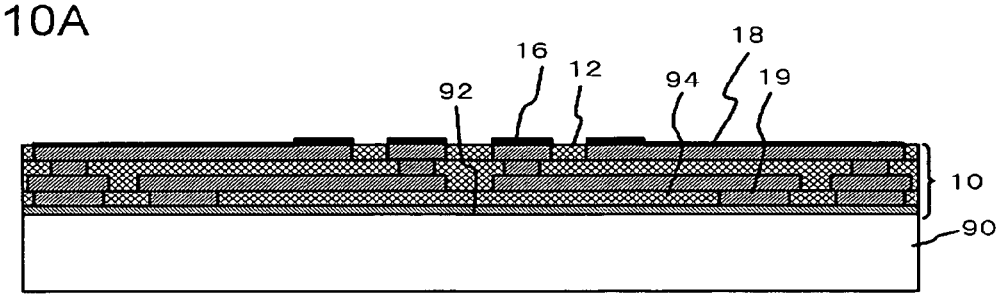
FIGS. 10A and 10B are cross-sectional views of the electronic circuit device, illustrating the embodiment of the method for manufacturing the electronic circuit device according to the present invention.

Thereafter, the solder wetting metallic films 16 are formed on the conductor interconnects 14 exposed in apertures of the resist layer 96 by a process such as an electrolytic plating process or electroless plating process (FIG. 9A). Next, an oxygen ($O_2$) plasma-processing or the like is conducted after the resist layer 96 is removed (FIG. 9B). In this case, a native oxide film (metal oxide film 18) is formed on portions of the surface of the conductor interconnect 14, where no solder wetting metallic film 16 is formed (FIG. 10A). Such native oxide film can be easily formed by simply leaving the circuit device within atmospheric air without conducting particular plasma-processing. As described above, the electronic circuit chip 10 is obtained.

Figure 10B:
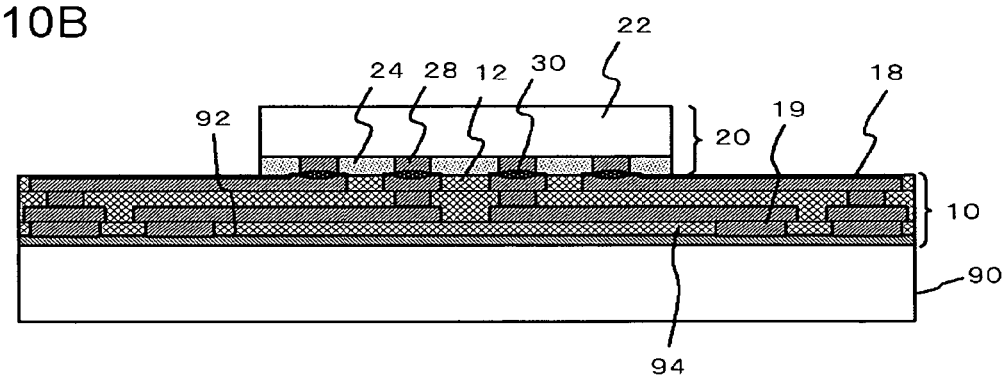

Next, the electronic circuit chip 10 is joined to the electronic circuit chip 20, which has been prepared in advance. In this operation for joining these circuits, as described above, the solder wetting metallic film 16 of the electronic circuit chip 10 is connected to the solder layer 27 of the electronic circuit chip 20 by heating the solder layer 27, while the solder layer 27 is pressed against the solder wetting metallic film 16. Having such procedure, the electronic circuit chips 10 and 20 are mutually joined (FIG. 10B).

Figure 11A:
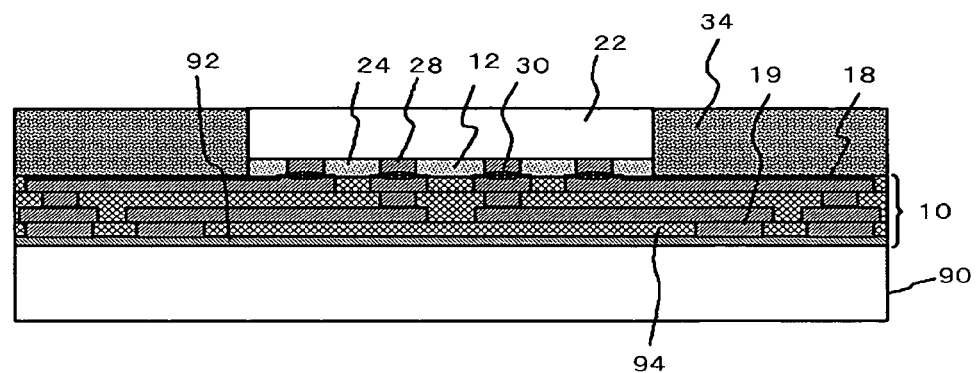
FIGS. 11A and 11B are cross-sectional views of the electronic circuit device, illustrating the embodiment of the method for manufacturing the electronic circuit device according to the present invention.
Figure 11B:
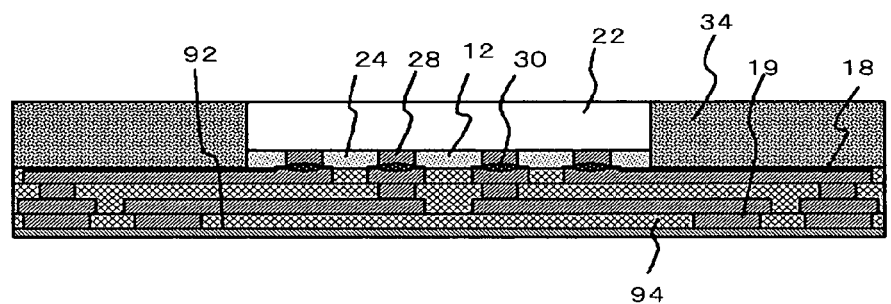
Figure 12:
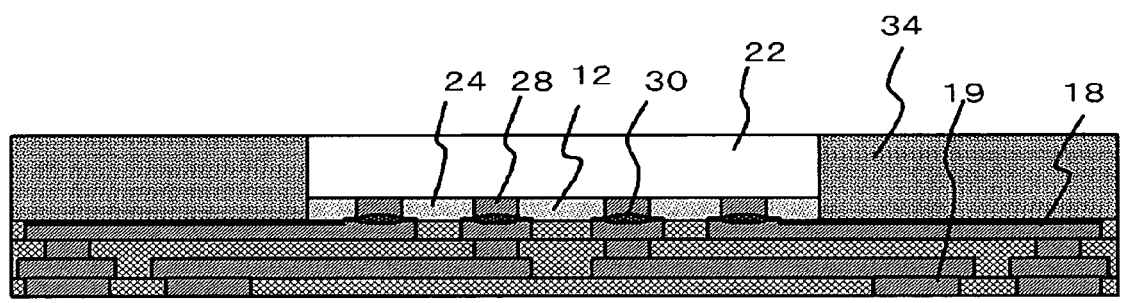
FIG. 12 is a cross-sectional view of the electronic circuit device, illustrating the embodiment of the method for manufacturing the electronic circuit device according to the present invention.

Further, the top surface of the electronic circuit chip 10 having the electronic circuit chip 20 mounted thereon is encapsulated with an encapsulating resin 34 (FIG. 11A). In this case, a back surface of the semiconductor chip 22 may be exposed, or may not be exposed. Typical encapsulating process available in the present embodiment may include a molding process, a printing process, a potting process and the like. Next, the silicon wafer 90 is removed from the electronic circuit chip 10 (FIG. 11B). Thereafter, the Cu film 92 remaining on the electronic circuit chip 10 is removed by an etch process (FIG. 12). Subsequently, the solder bump 32 is joined to the exposed upper surface of the external electrode pad 19 of the electronic circuit chip 10, and then a dividing operation of the wafer is carried out by a process such as a dicing process and the like. As described above, the electronic circuit device 1 shown in FIG. 1 is obtained.

Advantageous effects obtainable by employing the configuration of the present embodiment will be described. In the electronic circuit chip 10, the solder wetting metallic film 16 is provided on the conductor interconnect 14. The solder wetting metallic film 16 is composed of a metallic material, which requires higher free energy for forming an oxide thereof, as compared with a free energy required for forming an oxide of the metallic material composing the conductor interconnect 14. More specifically, the solder wetting metallic film 16 is resistant to being oxidized, as compared with the conductor interconnect 14. Therefore, a reduction in the wettability of the solder wetting metallic film 16 against solder, which is caused because the solder wetting metallic film 16 is oxidized, can be inhibited. Therefore, when the electronic circuit chip 10 is joined to another electronic circuit chip having solder provided on the surface thereof (electronic circuit chip 20 in the present embodiment), the solder wetting metallic film 16 may be interposed between the conductor interconnect 14 and solder, so that an improved connection reliability would be obtained. Thus, the electronic circuit chip 10, which is capable of exhibiting an improved connection reliability with other electronic circuit chips, can be achieved. In addition to above, Au, Ag, Pt or Pd may be preferably employed for a material of the solder wetting metallic film 16.

Actually in the present embodiment, the conductor interconnect 14 of the electronic circuit chip 10 is connected to the solder layer 27 of the electronic circuit chip 20 via the solder wetting metallic film 16. This provides an improved connection reliability between the conductor interconnect 14 and the solder layer 27.

Further, in the present embodiment, an injection of an underfill resin in the spacings between the electronic circuit chip 10 and the electronic circuit chip 20 or a formation of a solder resist film on the electronic circuit chip 10 are not necessary. Consequently, the configuration is suitable for a reduction in a connection density between both chips.

The metal oxide film 18 is formed on a region of the conductor interconnect 14, where no solder wetting metallic film 16 is provided. In general, wettability of an oxide of a metal against resins is higher than that of the metal itself. Therefore, an existence of the metal oxide film 18 therebetween provides an improved connection reliability between the conductor interconnect 14 and the adhesive resin layer 24. This configuration provides further improved connection reliability between the electronic circuit chip 10 and the electronic circuit chip 20. However, providing the metal oxide film 18 is not essential.

As a patterned conductor of the electronic circuit chip 10, an interconnect of the electronic circuit chip 10 is employed. As such, by utilizing an existing configuration as a patterned conductor, the electronic circuit chip 10 provided with a patterned conductor can be obtained, without causing an increase in number of manufacturing process operations. Meanwhile, Cu, Ni or Al, which is generally employed as an interconnect material, has a nature of being easily naturally oxidized. Therefore, when these metals are directly connected with solder, better connection reliability can not be obtained, as described above. Therefore, in such case, the electronic circuit chip 10 having the solder wetting metallic film 16 provided on the conductor interconnect 14 is particularly useful. However, it is not essential to employ an interconnect for a patterned conductor of the electronic circuit chip 10.

In the electronic circuit device 1, the alloy layer 30, which contains metallic elements composing the solder wetting metallic film 16 and the solder layer 27, respectively, is formed. This configuration provides considerably firm juncture between the electronic circuit chip 10 and the electronic circuit chip 20.

The conductor electrode 28 is composed of the conductor layer 26 and the solder layer 27 formed thereon. If the conductor electrode 28 is composed of only the solder layer 27, the whole conductor electrode 28 may be possibly melted when the electronic circuit chip 20 is joined to the electronic circuit chip 10, so that a height of the conductor electrode 28 could be considerably changed. On the contrary, in the present embodiment, the conductor layer 26 having higher melting point than the solder layer 27 is provided for serving as a base of the conductor electrode 28. Consequently, only a portion of the conductor electrode 28 (portion corresponding to solder layer 27) is melted when the electronic circuit chip 20 is joined to the electronic circuit chip 10, so that variation in height of the conductor electrode 28 would be reduced.

However, the conductor electrode 28 may be composed of only the solder layer 27. In addition to above, Cu or Ni may preferably be employed as a material of the conductor layer 26. In addition, Sn, SnAg, SnCu or SnAgCu may be preferably employed as a material of the solder layer 27.

A thermoplastic resin or a partially cured thermosetting resin may be preferably employed for a material of the adhesive resin layer 24.

It is not intended that the electronic circuit chip and method for manufacturing the electronic circuit device according to the present invention is limited to the configurations illustrated in the above-described embodiments, and thus various modifications thereof are available. For example, in the exemplary implement of the above-described embodiment, only one of the first and the second electronic circuit chips includes the semiconductor chip and the other is the interconnect member. Nevertheless, both of the first and the second electronic circuit chips may include a semiconductor chip, as shown in FIG. 13, or may be an interconnect member, as shown in FIG. 14.

Figure 13:
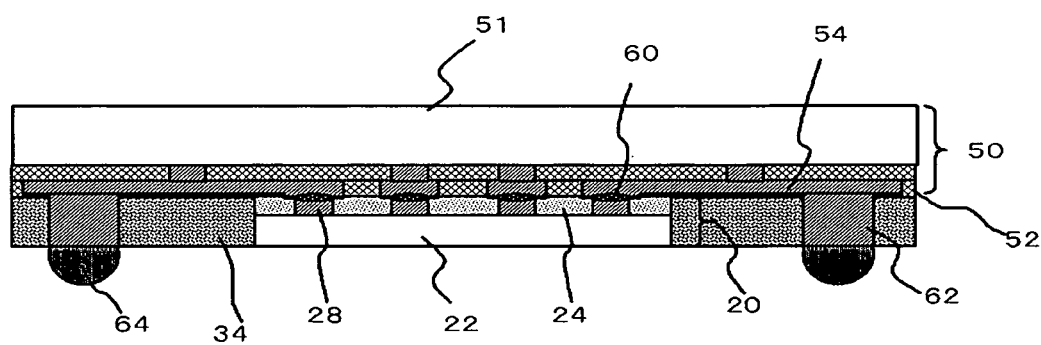
FIG. 13 is a cross-sectional view, illustrating an electronic circuit device according to a modified example of the embodiment.

In FIG. 13, electronic circuit chips 50 and 20 are provided, serving as the first and the second electronic circuit chips, respectively. Configuration of the electronic circuit chip 20 is the same as what has been described in reference to FIG. 1 and FIG. 3. The electronic circuit chip 50 includes a semiconductor chip 51. In addition, an insulating layer 52 is formed as a surface layer of the electronic circuit chip 50. In the insulating layer 52, a patterned conductor 54 that is exposed in the surface of the insulating layer 52 is formed. Further, on a portion of the patterned conductor 54 is formed a metallic film (not shown), which requires higher free energy for forming an oxide thereof, as compared with a free energy required for forming an oxide of the metallic material for composing the patterned conductor 54. This metallic film forms an alloy layer 60 in cooperation with the solder layer 27 of the electronic circuit chip 20.

In addition, the electronic circuit chip 20 is covered with the encapsulating resin 34. In the encapsulating resin 34, conductor posts 62 extending through the encapsulating resin 34 are formed. One end of the conductor post 62 is connected to the patterned conductor 54, and the other end thereof is connected to the solder bump 64. In addition to above, another semiconductor chip may be deposited on the semiconductor chip 22 and/or the semiconductor chip 51. In such case, a through-hole via may be formed in the semiconductor chips 22 and 51, thereby providing an electrical connection between the semiconductor chips.

Figure 14:
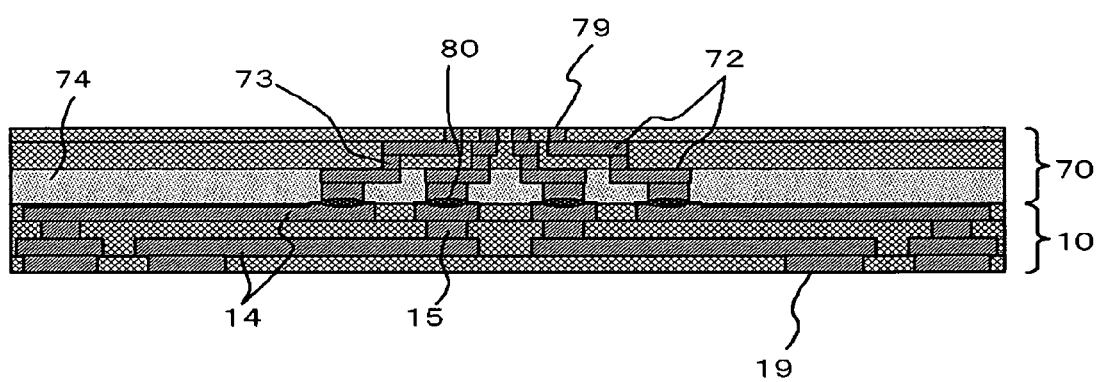
FIG. 14 is a cross-sectional view, illustrating an electronic circuit device according to a modified example of the embodiment.

In FIG. 14, electronic circuit chips 10 and 70 are provided, serving as the first and the second electronic circuit chips, respectively. Structure of the electronic circuit chip 10 is the same as described in reference to FIG. 1 and FIG. 2. Electronic circuit chip 70 is an interconnect member. An adhesive resin layer 74 is formed as a surface layer of the electronic circuit chip 70. In the adhesive resin layer 74, a solder layer (not shown) exposed in the surface of the adhesive resin layer 74 is formed. This solder layer forms an alloy layer 80 in cooperation with the solder wetting metallic film 16 of the electronic circuit chip 10.

In addition, the electronic circuit chip 70 has multiple-layered interconnect structure, and the conductor interconnects 72, which are formed in adjacent layers, respectively, are mutually connected through a via plug 73. Further, a back surface of the electronic circuit chip 70 (i.e., surface in the side opposing to the joined surface with the electronic circuit chip 10) is provided with exposed electrode pads 79, one end of which is connected to the conductor interconnect 72. The electrode pad 79 serves as a pad for connecting the semiconductor chip to the electronic circuit chip 70. According to the electronic circuit device having such structure, one interconnect member, which includes fine interconnect structure, and another interconnect member, which is desirable to be manufactured at lower cost with larger design rule, may be separately manufactured, and then the separately manufactured interconnect members may be joined together.

It is apparent that the present invention is not limited to the above embodiment, and may be modified and changed without departing from the scope and spirit of the invention.

What is claimed is:

1. A method for manufacturing an electronic circuit device, comprising:

preparing a first electronic circuit chip, said first electronic circuit chip comprising:
   an insulating layer provided as a surface layer;
   a patterned conductor provided in said insulating layer, said patterned conductor comprising a first metallic material and having a portion that is exposed in a surface of said insulating layer, said exposed portion of said patterned conductor being coplanar with said surface of said insulating layer; and
   a metallic film provided on a first portion of said exposed portion of said patterned conductor, said metallic film comprising a second metallic material which requires a free energy for forming an oxide that is higher than a free energy for forming an oxide that is required by said first metallic material;

preparing a second electronic circuit chip that includes a resin layer provided in a surface layer and a solder layer provided in said resin layer and exposed in a surface of said resin layer; and connecting said metallic film of said first electronic circuit chip and said solder layer of said second electronic circuit chip by heating said solder layer, while said solder layer is pressed against said metallic film, wherein said preparing said first electronic circuit chip comprises:
   forming a Cu film on a silicon wafer serving as a support substrate;
   forming a plurality of external electrode pads on said Cu film;
   forming a first insulating resin layer on said Cu film and covering said external electrode pads, said first insulating resin layer comprising one of polyimide resin and epoxy resin;
   exposing a top surface of said plurality of external electrode pads;
   forming a plurality of lower conductor interconnects on said first insulating resin layer, said forming said plurality of lower conductor interconnects comprising connecting said lower conductor interconnects to said external electrode pads;
   forming a plurality of via plugs on said plurality of lower conductor interconnects, said forming said plurality of via plugs comprising connecting said via plugs to said plurality of lower conductor interconnects;
   forming a second insulating resin layer on said first insulating resin layer, said forming said second insulating resin layer comprising covering said plurality of lower conductor interconnects and said via plugs with said second insulating resin layer;
   exposing top surfaces of said via plugs;
   forming upper conductor interconnect on said second insulating resin layer;
   forming said insulating layer in said upper conductor interconnect, said insulating layer being coplanar with said upper conductor interconnect, said patterned conductor comprising said plurality of lower conductor interconnects and said upper conductor interconnect;
   exposing a top surface of said insulating layer;
   forming a resist layer on a first portion of said upper conductor interconnect on which a metal oxide film will be formed and on said insulating layer;
   forming said metallic film on a second portion of said upper conductor interconnect not covered by said resist layer;
   removing said resist layer; and
   forming said metal oxide film on said first portion of said upper conductor interconnect, said metal oxide film comprising an oxide of said first metallic material.

2. The method for manufacturing an electronic circuit device according to claim 1, wherein said metal oxide film is provided on a second portion of said exposed portion of said patterned conductor where said metallic film is not provided.

3. The method for manufacturing an electronic circuit device according to claim 1, wherein said second metallic material comprises at least one of Au, Ag, Pt, and Pd.

4. The method for manufacturing an electronic circuit device according to claim 1, wherein said first metallic material comprises at least one of Cu, Ni, and Al.

5. The method for manufacturing an electronic circuit device according to claim 1, wherein an alloy layer comprises said metallic film and said solder layer.

6. The method for manufacturing an electronic circuit device according to claim 1, wherein said second electronic circuit chip comprises a conductor layer provided in said resin layer of said second electronic circuit chip, said solder layer being formed on an end surface of said conductor layer, said conductor layer comprising a conductor material that has a melting point which is higher, than a melting point of a solder material of said solder layer.

7. The method for manufacturing an electronic circuit device according to claim 6, wherein said conductor material of said conductor layer comprises at least one of Cu and Ni.

8. The method for manufacturing an electronic circuit device according to claim 6, wherein said conductor layer further comprises a multiple-layered structure comprising a Cu layer and an Ni layer.

9. The method for manufacturing an electronic circuit device according to claim 1 wherein said resin layer of said second electronic circuit chip comprises one of a thermoplastic resin and a partially cured thermosetting resin.

10. The method for manufacturing an electronic circuit device according to claim 1, wherein said solder layer comprises a solder material comprising at least one of Sn, SnAg, SnCu, and SnAgCu.

11. The method for manufacturing an electronic circuit device according to claim 1, further comprising joining said surface layer of said first electronic circuit chip with said second electronic circuit chip, said joining said surface layer comprising said connecting said metallic film.

12. The method for manufacturing an electronic circuit device according to claim 1, wherein said second metallic material comprises one of Ag, Pt, and Pd.

13. The method for manufacturing an electronic circuit device according to claim 1, wherein said first metallic material comprises Ni.

14. The method for manufacturing an electronic circuit device according to claim 1, wherein said metal oxide film comprises an oxide of Ni.

* * * * *